US005191176A

United States Patent [19]

Wright

[11] Patent Number: 5,191,176

[45] Date of Patent: Mar. 2, 1993

[54] AUDIO LOUDSPEAKER ENCLOSURE

[76] Inventor: Junius B. Wright, 2034½ San Antonio, Alameda, Calif. 94501

[21] Appl. No.: 659,007

[22] Filed: Feb. 21, 1991

[51] Int. Cl.[5] .......... H05K 5/00

[52] U.S. Cl. .......... 181/148; 181/199

[58] Field of Search .......... 181/148, 144, 150, 153, 181/156

[56] References Cited

U.S. PATENT DOCUMENTS 3,983,333 9/1976 Allison .......... 181/144

4,280,586 7/1981 Petersen .......... 181/150

*Primary Examiner*—Michael L. Gellner

*Assistant Examiner*—Eddie C. Lee

*Attorney, Agent, or Firm*—Limbach & Limbach

[57] ABSTRACT

An audio loudspeaker enclosure is presented. The enclosure has surfaces which resonate across a broad band of low frequencies produced by the loudspeaker, thus enhancing the quality of low frequency sound reproduction.

8 Claims, 1 Drawing Sheet

AUDIO LOUDSPEAKER ENCLOSURE

BACKGROUND

1. Field of the Invention

The present invention relates to an enclosure for audio loudspeakers, and more particularly, to an improved enclosure which resonates across a low frequency band to enhance low frequency sound reproduction.

2. Discussion of the Prior Art

Loudspeaker enclosures are generally well known. Typically, various loudspeaker and enclosure combinations are used to reproduce music as part of a home or commercial audio entertainment system. At low frequencies, i.e., less than 250 Hz, it is known that direct radiating loudspeakers tend to be omnidirectional, producing soundwaves from the front and back of the loudspeaker which are of equal intensity, but opposite phase. The forward and backward traveling soundwaves thus interfere destructively, reducing effective power output and reducing the volume of sound produced at those frequencies.

This problem can be solved through the use of a baffle, and an enclosure for the loudspeaker acts as a baffle. The backward traveling soundwaves are bounced off the back surface of the enclosure to interfere constructively, rather than destructively, with the forward traveling soundwaves. Thus, increased power and efficiency result from a well designed baffle. However, since wavelength is inversely proportional to frequency, a relatively large volume enclosure is required at low frequencies.

The use of baffles introduces another problem. The resulting enclosure is subject to developing resonance at one or more frequencies. This resonance increases power output at the resonating frequencies and results in a "boominess" that dominates, or at least interferes with faithful sound reproduction across the broad range of frequencies in the source program. Since this resonance occurs only at particular frequencies, the prior art enclosure designs have sought to eliminate the resonance completely, and rely solely on the source program and amplifying and equalization equipment to obtain an improved sound reproduction at low frequencies. See U.S. Pat. No. RE 31,483 (Hruby). It would be desirable to take advantage of the tendency to develop low frequency resonance to reinforce and enhance the reproduction of low frequency source material.

SUMMARY OF THE INVENTION

An enclosure for an audio loudspeaker is presented. First and second flexible, symmetrical panels are positioned in correspondence with each other. Means are provided to couple the first and second panels together in such a way that the panels are free to resonate. Means are provided to support the loudspeaker between the panels.

In the preferred embodiment, the first and second panels are equilateral right triangles. The first and second panels are coupled together along their equilateral sides by third and fourth panels. The third and fourth panels are each preferably three-sided, with two long sides converging at one end and extending in a convex manner symmetrically about a central axis to the other end, where they meet the third side which is perpendicular to the central axis. A fifth panel having an opening for mounting a loudspeaker therein is mounted between the respective hypotenuses of the first and second panels.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
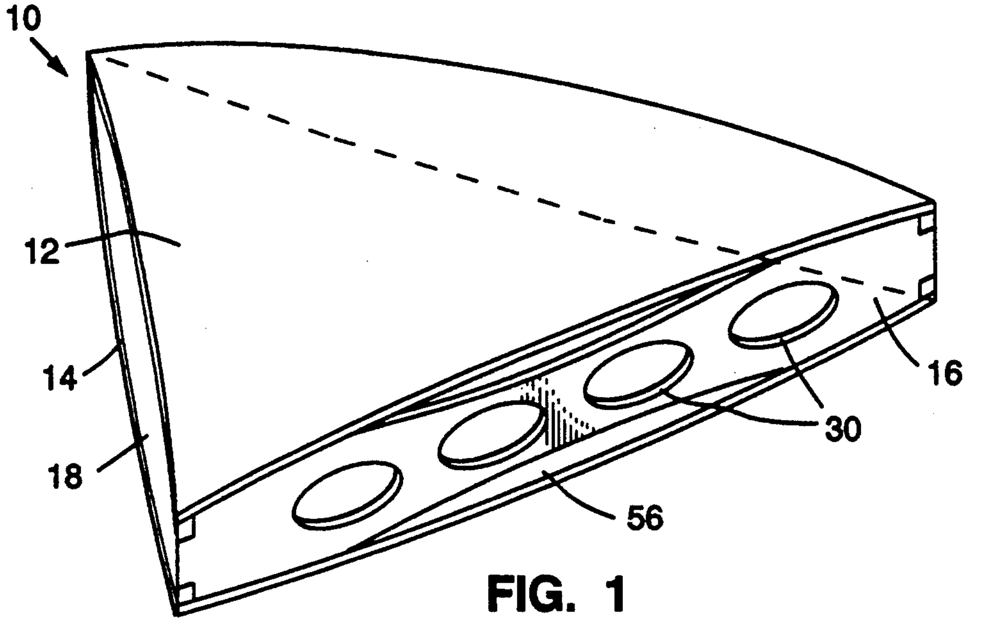
FIG. 1 is an isometric view of a loudspeaker enclosure made in accordance with the present invention.

The present invention is an audio loudspeaker enclosure having surfaces which resonate across a band of low frequencies produced by the loudspeaker, thus enhancing the quality of low frequency sound reproduction. Referring to FIG.. 1, the basic components of the enclosure 10 are top panel 12, bottom panel 14, front panel 16, left panel 18, and right panel 18'.

The left panel 18 is made of rigid material such as ⅝" fir stock. Panel 18 has three edges 22, 24, and 26. Edges 22 and 24 converge at one end of the panel and extend as convex curves in symmetry about the central longitudinal axis of the panel. The third edge 26 is perpendicular to the central axis and has a notch 28 for coupling with the front panel 16. A sound port 30 may also be provided in left panel 18. The right panel 18' is identical to left panel 18, having edges 22', 24', 26'.

The front panel 16 is also made of a rigid material, and has elliptical openings 32 for the mounting of loudspeakers. The front panel 16 has two short sides 34, 36 each having a tab 38, 40, respectively, to couple with the corresponding notches 28, 28' in panels 18, 18'. The front panel 16 also has two long sides 42, 44. The purpose of the front panel is primarily as a loudspeaker mounting member, although some structural support is gained by attaching the top panel 12 and bottom panel 14 to the front panel 16.

Figure 2A:
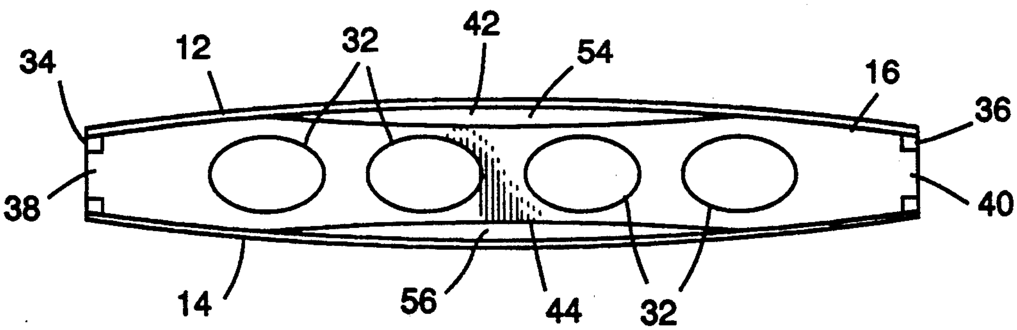
FIG. 2*a* is a front plan view of the loudspeaker enclosure of FIG. 1.
Figure 2B:
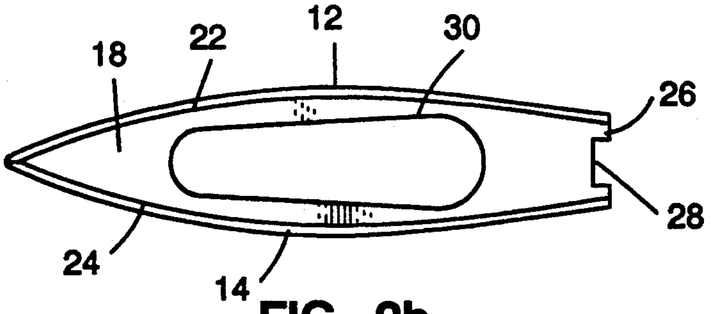
FIG. 2*b* is a side auxiliary view of the loudspeaker enclosure of FIG. 1.
Figure 2C:
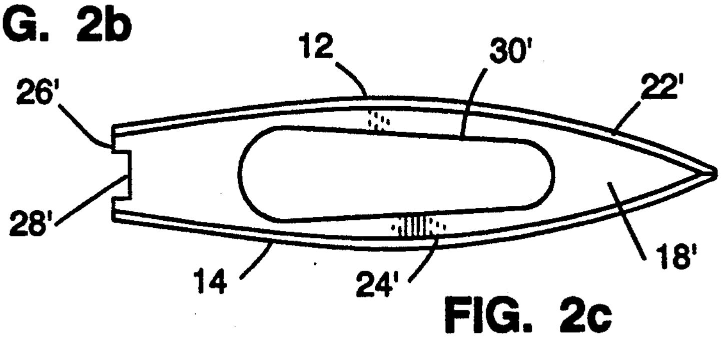
FIG. 2*c* is a side auxiliary view of the loudspeaker enclosure of FIG. 1.

The top panel 12 and bottom panel 14 are preferably identical and opposing equilateral right triangles. The front panel 16 is mounted between the hypotenuse of top panel 12 and the hypoteneuse of bottom panel 14. The top panel 12 and the bottom panel 14 are coupled together along left panel 18 and right panel 18'. Thus, the top panel 12 and bottom panel 14 must be flexible enough to conform to the convex edges of the left panel 18 and right panel 18', and the top and bottom panels are flexed outwardly, as shown in FIG. 2, as a result of the coupling. This creates a pair of sound ports 54, 56 between the front panel 16, and top panel 12 and bottom panel 14, respectively.

Ideally, the hypotenuse of top panel 12 and bottom panel 14 should be as long as possible to allow the surface of each panel to develop resonance at the lowest possible frequencies. The lengths required to resonate particular frequencies can be determined from the well-known wave relationship $\nu = f\lambda$, where $\nu$ = wave velocity, f = wave frequency, and $\lambda$ = wavelength. For example, given that the speed of sound in air at 70° F. and 1 atmosphere $\nu=1130$ feet/second, then panel resonance at 20 Hz (lowest audible frequency to the human hear) is developed across a length of 56.5 feet (1130 feet/-second ÷20 cycles/second). Obviously, such a large structure would prove impractical for most applications. In practice, the use of quarter wave resonance will permit reasonable sizing of the enclosure and still obtain effective resonance quality. A preferred construction takes into account commercially available materials, such as 4'×8' sheets of plywood stock. A ¼" thick, 4'×8' sheet of marine grade Douglas Fir plywood yields good results. From such stock, three panels may be cut, two of which have a hypotenuse of 68". At this length, quarter wave resonance can be developed at 49.9 Hz. Additionally, a panel with an 8' hypotenuse and identical 5'8" sides may be cut from the sheet, and an 8' hypotenuse develops quarter wave resonance for 35.3 Hz. It should be noted that the calculated frequencies are for peak resonance only. In practice, resonance is heard at frequencies well below the peak value. Advantageously, the enclosure is positioned in a standard room relative to the corner of the room such that the right angle corners of top panel 12 and bottom panel 14 correspond to the right angle corner of a room (not pictured), such that the effective enclosure size is increased by making use of the walls to reflect rearward travelling sound waves and gain the benefit of reverberation to enhance the sound quality.

It should be understood that the invention is not intended to be limited by the specifics of the above-described embodiment, but rather defined by the accompanying claims.

I claim:

1. An enclosure for a system of audio loudspeakers, comprising:

a. a first panel having a surface that is generally flat and flexible and an equilateral right triangle shape, said first panel having at least one dimension that corresponds to a resonant quarter wavelength of less than 100 hertz;

b. a second panel substantially parallel to the first panel and having a surface that is generally flat and flexible and an equilateral right triangle shape that is symmetrical, said second panel having at least one dimension that corresponds to a resonant quarter wavelength of less than 100 hertz;

c. means for coupling the first panel to the second panel; and d. means for supporting at last one loudspeaker between the first and second panels wherein the first and second panels have corresponding equilateral sides which define a pair of side edges of the enclosure, and wherein a first point of intersection of the equilateral sides of the first panel is connected to a second point of intersection of the equilateral sides of the second panel, wherein the hypotenuses of each of the first and second panels define a front edge of the enclosure, and wherein the means for supporting at least one loudspeaker is positioned so that the loudspeaker is facing outwardly from the front edge.

2. The audio loudspeaker enclosure of claim 1, wherein the means for coupling the first panel to the second panel comprises a third panel and a fourth panel and wherein the third panel couples one of the equilateral sides of the first panel to one of the equilateral sides of the second panel, and wherein the fourth panel couples another of the equilateral sides of the first panel to another of the equilateral sides of the second panel.

3. The audio loudspeaker enclosure of claim 1, wherein the third panel has a generally flat surface, a first convex edge and second convex edge symmetrically disposed and converging at the first point of intersection, and a third edge coplanar with the front edge of the enclosure, and wherein the fourth panel has a generally flat surface, a first convex edge and second convex edge symmetrically disposed and converging at the second point of intersection, and a third edge coplanar with the front edge of the enclosure, such that coupling of the first and second panels to the third and fourth panels causes the first and second panels to flex outwardly.

4. The audio loudspeaker enclosure of claim 1, wherein each of the third and fourth panels has an opening centrally located therein.

5. The audio loudspeaker enclosure of claim 1, wherein the means for supporting the loudspeaker comprises a fifth panel having a generally flat surface with an opening therein for loudspeaker mounting and wherein the fifth panel is mounted across the front edge of the enclosure.

6. The audio loudspeaker enclosure of claim 1, wherein the fifth panel is mounted so as to leave a pair of openings between the fifth panel and the flexed first and second panels.

7. An enclosure for a system of audio loudspeakers, comprising:

a. a first flexible panel with an equilateral right triangle shape;

b. a second flexible panel with an equilateral right triangle shape and positioned in correspondence to the first panel;

c. a third panel having three edges, wherein the first and second edges of the third panel converge at a first point of intersection at one end of the panel, then extend in a convex manner symmetrically about a central longitudinal axis of the third panel, and terminate at the third edge of the third panel, the third edge of the third panel being perpendicular to the central axis of the third panel, and wherein the first and second panel are coupled together along one of their corresponding equilateral sides by the third panel, such that the first and second panel are flexed along the first and second edges of the third panel and meet at the first point of intersection of the equilateral sides;

d. a fourth panel having three edges, wherein the first and second edges of the fourth panel converge at a second point of intersection at one end of the fourth panel, then extend in a convex manner symmetrically about a central longitudinal axis of the fourth panel, and terminate at the third edge of the fourth panel, the third edge of the fourth panel being perpendicular to the central axis of the fourth panel, and wherein the first and second panel are coupled together along another of their corresponding equilateral sides by the fourth panel, such that the first and second panel are flexed along the first and second edges of the fourth panel and meet at the second point of intersection of the equilateral sides; and e. a fifth panel mounted between the respective hypotenuses of the first and second panels, wherein the fifth panel has an opening therein for mounting at least one loudspeaker.

8. The audio loudspeaker enclosure of claim 1, wherein the enclosure is positioned in a standard room relative to a corner of the room such that the right angle corner of the first and second panels correspond to the right angle corner of the room.

* * * * *